(12) United States Patent
Huang

(10) Patent No.: US 7,230,503 B1
(45) Date of Patent: Jun. 12, 2007

(54) IMBALANCED DIFFERENTIAL CIRCUIT CONTROL

(75) Inventor: Yunteng Huang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 337 days.

(21) Appl. No.: 10/189,128

(22) Filed: Jul. 2, 2002

Related U.S. Application Data

(60) Provisional application No. 60/360,310, filed on Feb. 28, 2002, provisional application No. 60/360,340, filed on Feb. 28, 2002, provisional application No. 60/360,333, filed on Feb. 28, 2002.

(51) Int. Cl.
H03B 5/12 (2006.01)
H03B 5/18 (2006.01)
H03K 3/282 (2006.01)

(52) U.S. Cl. .................................. 331/117 R
(58) Field of Classification Search ............ 331/117 R, 331/117 FE, 117 D, 108 A, 107 P, 16, 17, 331/167, 177 R, 36 C, 177 V, 25, 177 Y
See application file for complete search history.

(56) References Cited

U.S. PATENT DOCUMENTS

| | | | | |
|---|---|---|---|---|
| 4,169,251 A | * | 9/1979 | Laakmann | 372/64 |
| 4,584,544 A | * | 4/1986 | Hettiger | 333/174 |
| 5,187,450 A | * | 2/1993 | Wagner et al. | 331/96 |
| 5,451,915 A | * | 9/1995 | Katzin et al. | 333/213 |
| 5,486,796 A | * | 1/1996 | Ishikawa et al. | 331/117 R |
| 5,561,398 A | | 10/1996 | Rasmussen | |
| 5,564,100 A | | 10/1996 | Huang et al. | |
| 5,708,394 A | * | 1/1998 | Karlquist | 331/1 R |
| 5,805,016 A | | 9/1998 | Jiang | |
| 5,905,414 A | | 5/1999 | Motoi | |
| 5,929,716 A | * | 7/1999 | Komori et al. | 331/135 |
| 5,942,950 A | | 8/1999 | Merenda | |
| 5,952,952 A | | 9/1999 | Choi et al. | |
| 5,982,228 A | * | 11/1999 | Khorramabadi et al. | 327/553 |
| 6,009,318 A | * | 12/1999 | Freed | 455/326 |
| 6,013,958 A | * | 1/2000 | Aytur | 307/109 |
| 6,150,891 A | | 11/2000 | Welland et al. | |
| 6,268,777 B1 | * | 7/2001 | Welch | 331/117 FE |
| 6,268,778 B1 | | 7/2001 | Mucke et al. | |
| 6,281,758 B1 | | 8/2001 | Elsayed et al. | |
| 6,292,065 B1 | | 9/2001 | Friedman et al. | |
| 6,317,008 B1 | * | 11/2001 | Gabara | 331/117 R |
| 6,323,736 B2 | * | 11/2001 | Jansson | 331/44 |

(Continued)

*Primary Examiner*—My-Trang Nuton
(74) *Attorney, Agent, or Firm*—Zagorin O'Brien Graham LLP

(57) ABSTRACT

A differential circuit includes first and second side circuits which are coupled to receive control signals in such a way as to introduce an intentional imbalance in the differential circuit for certain benefits discussed herein. An exemplary pseudo-differential LC tank circuit is described which includes first and second side nodes, and an inductance circuit and a variable capacitance circuit coupled between the nodes. The inductance and variable capacitance circuits may be broken out into separate tanks to achieve certain magnetic noise reduction benefits. Each exemplary variable capacitance circuit includes a first variable capacitance coupled between the first side node and a common ground node, and a second variable capacitance coupled between the second side node and the common ground. Each of the first and second variable capacitances is coupled to receive control lines for controlling the capacitance of the first and second variable capacitance circuits in a pseudo-differential manner. Each variable capacitance includes at least one of many types of switch-capacitor cells, some of which are described herein.

44 Claims, 9 Drawing Sheets

U.S. PATENT DOCUMENTS

| | | | |
|---|---|---|---|
| 6,388,532 B1 * | 5/2002 | Babcock | 331/44 |
| 6,469,919 B1 * | 10/2002 | Bennett | 363/56.02 |
| 6,529,015 B2 * | 3/2003 | Nonoyama et al. | 324/678 |
| 6,574,288 B1 * | 6/2003 | Welland et al. | 375/327 |
| 6,583,609 B1 * | 6/2003 | Pardoen | 323/283 |
| 6,600,437 B1 * | 7/2003 | Confalonieri et al. | 341/150 |
| 6,646,581 B1 * | 11/2003 | Huang | 341/143 |
| 6,753,738 B1 * | 6/2004 | Baird | 331/25 |
| 6,760,575 B2 * | 7/2004 | Welland | 455/260 |

* cited by examiner

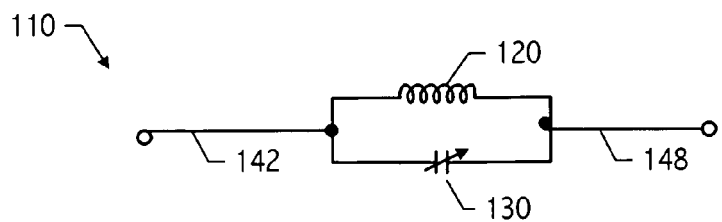
FIG. 1A
(PRIOR ART)
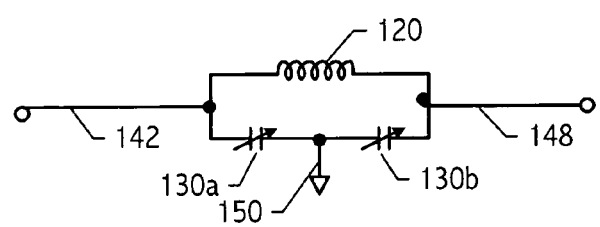
FIG. 1B
(PRIOR ART)
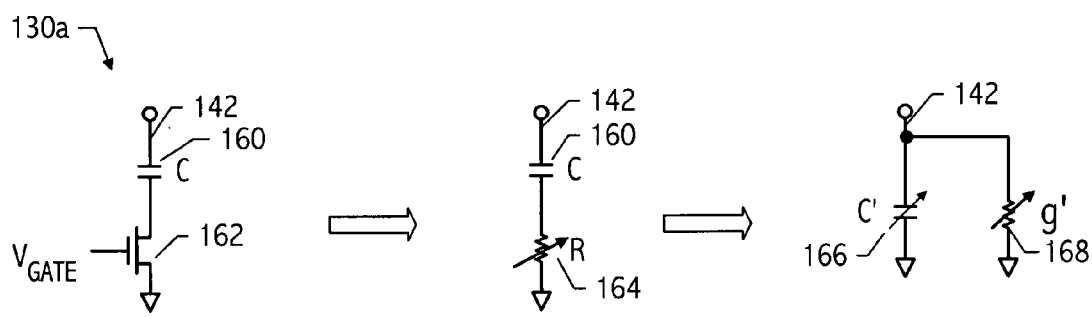
FIG. 2A
(PRIOR ART)
FIG. 2B
(PRIOR ART)
FIG. 2C
(PRIOR ART)
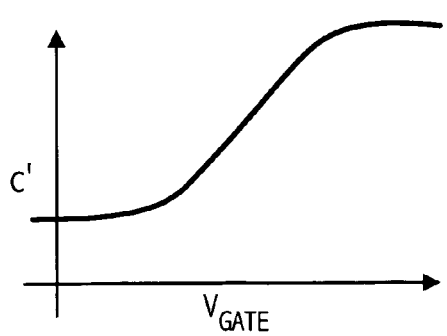
FIG. 2D
(PRIOR ART)
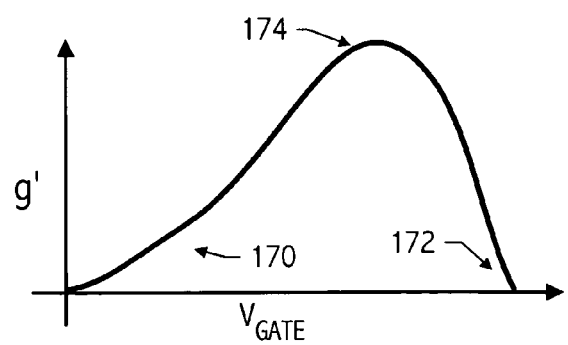
FIG. 2E
(PRIOR ART)

IMBALANCED DIFFERENTIAL CIRCUIT CONTROL

CROSS-REFERENCE TO RELATED APPLICATION(S)

This application claims priority to the following provisional patent applications which are hereby incorporated by reference in their entirety:

U.S. provisional patent application Ser. No. 60/360,310, entitled "Digital-to-Analog Converter Circuit Incorporating Hybrid Sigma-Delta Modulator Circuit," filed Feb. 28, 2002, and naming Yunteng Huang as inventor;

U.S. provisional patent application Ser. No. 60/360,340, entitled "Optimal Control of a Capacitor Array Varactor for Improved Control of Gain and Noise," filed Feb. 28, 2002, and naming Yunteng Huang as inventor; and U.S. provisional patent application Ser. No. 60/360,333, entitled "Digital Expander Apparatus and Method for Generating Multiple Analog Control Signals Particularly Useful for Controlling a Sub-Varactor Array of a Voltage Controlled Oscillator," filed Feb. 28, 2002, and naming Yunteng Huang and Bruno Garlepp as inventors.

BACKGROUND

1. Field

The present invention relates to electrical signal adjustment, and, more particularly, to differential tuning of electrical signals such as clock signals or clock control signals which are useful in feedback control systems such as phase-locked loops.

2. Description of the Related Art

Variable capacitance circuits are often used to tune electrical signals in a variety of circuits including, for example, feedback systems. Feedback systems are well known in the art and are found in a multitude of different configurations, and although the discussion below need not be limited to feedback systems, a preliminary discussion of a typical feedback system is instructive and provides an exemplary context for discussion of the invention claimed herein.

One well-known feedback system configuration is a phase-locked loop (PLL) which may, for example, be configured for clock and data recovery applications. Such a configuration may be used for recovering clock and data streams compatible with the SONET specification, as well as others. PLLs often include at least three devices coupled in series: a phase/frequency detector, a loop filter, and a voltage controlled oscillator (VCO). The phase/frequency detector generates an error signal which is a function of the phase/frequency difference between an input data signal and a feedback clock signal. The loop filter low-pass filters the error signal to provide a control voltage signal to the VCO to influence the frequency (and hence the phase) of the VCO output clock signal (e.g., the feedback signal received by the phase/frequency detector). The loop filter frequently includes an integrator block which is implemented using a charge pump and a loop filter capacitor. Many different variations on the above PLL are known including modifications to the above described elements and additions to the above described loop.

If such a PLL were implemented using discrete components, precision components could be used to provide a nominal VCO frequency relatively close to a desired center frequency. However, such a discrete implementation is costly and requires a large amount of printed circuit board space, and more than likely would have difficulty achieving the performance required of modern systems while operating at an acceptable power level. Consequently, most VCOs are implemented monolithically (i.e., on a single integrated circuit die). As is well known in the art, the absolute value of certain parameters on an integrated circuit may vary greatly due to process variations (e.g., lot-to-lot variations, wafer-to-wafer variations within a lot, die-to-die variations within a wafer) and as environmental variables change (e.g., die temperature, power supply voltage variations, etc.). Even though the tracking of certain parameters within a single integrated circuit is frequently quite good (which is the basis of many advantageous circuit techniques), the nominal frequency of many VCO circuits can vary greatly from die to die. While the frequency of the VCO can inherently be adjusted by an appropriate control voltage, the performance of the VCO may degrade if the control voltage otherwise necessary to achieve the desired VCO frequency falls too close to either the upper extreme or the lower extreme of its range. Said differently, such a PLL performs more optimally when the control voltage for the VCO is nominally centered within its expected voltage range.

One possible technique increases the gain of the VCO so that large changes in VCO frequency may be achieved by changes in the control voltage well within the expected range of control voltages. In principle this would allow a PLL to compensate for a large deviation in VCO "center frequency" without requiring a control voltage dangerously close to "running out of range." But there are detrimental consequences of increasing the VCO gain, including danger of locking onto a harmonic, and increased noise and jitter of the system. Moreover, with most VCO circuit structures it is difficult to arbitrarily provide an ever higher and higher tuning range and still achieve good frequency and phase stability.

One approach to accommodating the VCO center frequency variations involves trimming the frequency using, for example, a precision laser. After the semiconductor fabrication steps are complete, and either during wafer-level testing or possibly after singularization of individual circuit dies, the VCO is tested to determine its center frequency, and various circuit elements (e.g., resistors, capacitors) are trimmed to adjust the center frequency to the desired value. The remaining testing and packaging operations are then performed to complete the manufacturing of the circuits. Alternatively, such trimming may also be accomplished using a flash memory programming technique coupled with appropriate selection circuits, although this requires a semiconductor process capable of forming compatible flash memory elements. In either case, such trimming is a "permanent" adjustment of the center frequency during manufacture, but it adds costly manufacturing steps to either accomplish laser trimming after wafer fabrication or to provide a semiconductor process capable of implementing flash memory structures or other kinds of programmable structures. Moreover, such trimming is performed once during manufacture, and cannot adjust for subsequent changes in environmental conditions that the circuit may be called upon to operate under.

Another approach to accommodating the VCO center frequency variations involves calibrating the VCO center frequency each time the circuit is powered-up. Such techniques may involve comparing the center frequency against an externally provided reference frequency signal and setting a number of storage elements (e.g., registers) to appropriately adjust the center frequency. Such storage elements are volatile and lose stored data when the circuit loses power. An example of a device that performs such a calibration upon power-up is the Si4133G RF Synthesizer, which is available from Silicon Laboratories, Inc. based in Austin, Tex.

These approaches are valuable additions to the state of the art, but they cannot accommodate variations in the center frequency as environmental conditions change, as semiconductor parameters drift over time (e.g., threshold voltage shifts), or as other artifacts of component aging occur. This becomes increasingly more important in certain industrial systems which are put into operation and virtually never shut down. Examples include various interface circuits within the telecommunications infrastructure, which may operate for years without an opportunity to recalibrate during a subsequent power-up operation.

An effective way to adjust frequency control signals or other electrical signals is needed to accommodate environmental or parametric changes in a feedback system or any other system which occur after the system is powered up and while operational, without negatively impacting the operation of the system within its intended specifications.

SUMMARY

It has been discovered that a differential circuit may be controlled using differentially imbalanced control signals, for example, to improve control of gain and noise. For example, a capacitor array varactor including selectively enabled capacitors may be used to improve control of circuits and signals such as VCOs and VCO outputs. By implementing selectively enabled capacitors in a differential circuit environment, and by selectively enabling such capacitors in a non-fully-differential manner, greater control may be obtained without introducing an intolerable amount of differential noise.

Such a varactor is useful in implementing the PLL function found in clock and data recovery circuits, clock multiplication units, clock cleaning devices, etc., which advantageously incorporate multiple control signals to affect a frequency change. These analog (or digital) signals can change one control line (or one bit) at a time, and the single line which changes may be used to achieve a controlled transition time (or ramp rate) which is slow enough to cause a very gradual change in the value of the associated tuning elements. As a result, the PLL maintains lock during and after the digital signal changes state, and more importantly, maintains its phase accuracy so that the operation of the PLL, including subtle specifications such as input data jitter tolerance and jitter generation are not negatively impacted.

In a broader context of the present invention, such a capability may be accomplished in a pseudo-differential LC tank circuit. For example, an exemplary pseudo-differential LC tank circuit includes first and second side nodes, and inductance circuit and a variable capacitance circuit. The inductance circuit is coupled between the first and second side nodes. The variable capacitance circuit is coupled between the first and second side nodes. The variable capacitance circuit includes a first variable capacitance coupled between the first side node and a common ground node, and a second variable capacitance coupled between the second side node and the common ground. Each of the first and second variable capacitances are coupled to receive control lines for controlling the capacitance of the first and second variable capacitance circuits in a pseudo-differential manner.

In another embodiment, a differential variable capacitance circuit includes at least one differential pair of variable capacitance cells. Each of the pair of cells includes a first variable capacitance cell on a first differential side and a second variable capacitance cell on a second differential side. The first variable capacitance cell is controllable to provide a first capacitance having a value different from a capacitance of the second variable capacitance cell.

In another embodiment, a capacitor array varactor includes two or more arrays of capacitance devices. A first array of capacitance devices is controllable by first differential control signals, and a second array of capacitance devices is controllable by second differential control signals. At least one first differential control signal is adjustable independent from the at least one of the second differential control signal.

In another embodiment, a quadratic differential LC tank circuit includes first and second side nodes, and first and second tanks. The first tank includes a first inductance circuit, and first and second quadrant variable capacitance circuits. The first inductance circuit is coupled between the first and second side nodes. The first quadrant variable capacitance circuit is coupled between the first side node and a common ground. The second quadrant variable capacitance circuit is coupled between the second side node and the common ground. The second tank includes a second inductance circuit, and third and fourth quadrant variable capacitance circuits. The second inductance circuit is coupled between the first and second side nodes. The third quadrant variable capacitance circuit is coupled between the first side node and a common ground. The fourth quadrant variable capacitance circuit is coupled between the second side node and the common ground. Each quadrant variable capacitance receives a corresponding plurality of control signals for varying the capacitance of the quadrant in a pseudo-differential manner.

In another embodiment, a differential circuit includes first and second differential side circuits and a control circuit. The control circuit is coupled to convey a first plurality of control signals to the first differential side circuit and a second plurality of control signals to the second differential side circuit to introduce a differential imbalance in the differential circuit.

In another embodiment, a method is provided regarding a differential circuit which includes first and second differential pair circuits. The method includes the steps of providing a first control signal to the first differential pair circuit, and providing a second control signal to the second differential pair circuit so that a differential imbalance occurs in the differential circuit.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art, by referencing the accompanying drawings. The use of the same reference symbols in different drawings indicates similar or identical items.

FIGS. 1A and 1B are schematic diagrams of an LC tank circuit useful for the present invention.

FIGS. 2A, 2B, and 2C are schematic diagrams of a variable capacitance circuit and its modeling.

FIGS. 2D and 2E are graphs showing characteristics of the modeled circuit element shown in FIG. 2C.

DESCRIPTION OF THE PREFERRED EMBODIMENT(S)

Figure 3:
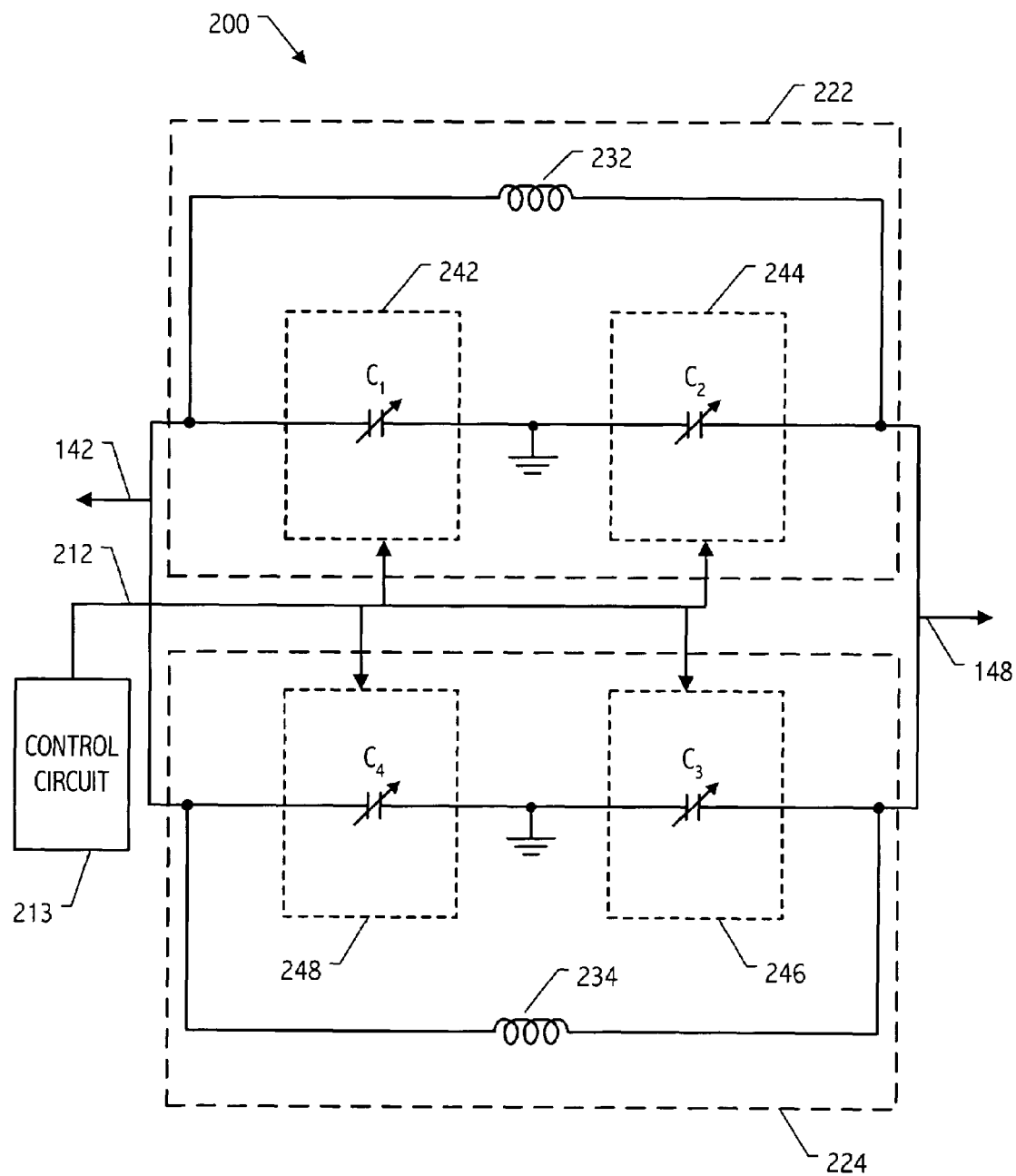
FIG. 3 is a schematic diagram of an LC tank circuit including a variable capacitance circuit in accordance with the present invention.

The following discussion is intended to provide a detailed description of at least one example of the invention to aid those skilled in the art to understand and practice the invention. For example, FIG. 1 and the following figures, and the discussion related thereto, describe at least one exemplary variable capacitance control system. This exemplary system provides a useful reference in discussing various aspects of the invention. Of course, the description of the system has been simplified for purposes of discussion, and it is just one of many different types of appropriate systems that may be used in accordance with the invention. Consequently, the following discussion should not be taken to be limiting of the invention itself. Rather, any number of variations may fall within the scope of the invention which is properly defined in the claims following this description.

FIG. 1A shows a resonant LC tank circuit 110 having a variable capacitor 130 coupled in parallel with a fixed inductor 120 between nodes 142 and 148. Such a resonant circuit is particularly useful in many VCO circuits which use differential circuitry, and is frequently connected between a pair of differential nodes of a VCO such as, for example, differential nodes of a gain block. As a balanced differential circuit, a virtual ground may be visualized "in the middle" of the variable capacitor 130. As shown in FIG. 1B, the single variable capacitor 130 may be replaced with a pair of variable capacitors 130a and 130b respectively connecting nodes 142 and 148 to a common ground node 150.

Variable capacitance devices such as varactor diodes may be used to provide variable capacitance adjusted control signals. Other embodiments may use selectively enabled capacitors. Compared to a variable capacitor literally connecting two circuit nodes together, a variable capacitor connecting a circuit node to ground is easier to implement. One implementation of variable capacitor 130a is shown in FIG. 2A, which shows a switch-capacitor cell including a fixed capacitor 160 connected in series with a switch such as N-channel transistor 162 whose source terminal is connected to ground. A variable gate voltage $V_{GATE}$ (sometimes denoted herein as $V_G$) is applied to the gate terminal of transistor 162 to control the conductivity of the transistor 162. The range of gate voltages as well as the particular transistor threshold voltage may both be chosen to provide a switch transistor that is fully turned off at one extreme of the gate voltage range (e.g., at $V_1$ in FIG. 13), and substantially turned on (i.e., conductive) at the other extreme of the gate voltage range (e.g., at $V_2$ in FIG. 13). The transistor 162, in effect, functions as a variable resistor (as well as a switch). Consequently, the implementation of variable capacitor 130a may be modeled, as depicted in FIG. 2B, as a variable resistance 164 in series with the fixed capacitor 160. For a narrow frequency band around the VCO oscillation frequency, this series circuit in turn may be modeled by an equivalent parallel circuit, as shown in FIG. 2C. This parallel circuit includes a corresponding variable capacitor 166 connected in parallel with a variable conductance 168, both connected between node 142 and ground.

The magnitude of both the variable capacitor 166 and the variable conductance 168 vary as a function of the gate voltage $V_{GATE}$ applied to transistor 162. The magnitude of the variable capacitance 166 (indicated as C') as a function of the gate voltage $V_{GATE}$ applied to transistor 162 is plotted in FIG. 2D. When the gate voltage $V_{GATE}$ is low, the resistance of transistor 162 is high (assuming an N-channel transistor), and not much current flows through the transistor 162. Consequently the capacitance C' is very low because the circuit 130a is virtually an open circuit. When the gate voltage $V_{GATE}$ is high, the resistance of the transistor 162 is low, and the capacitor 160 terminal is held to ground. Consequently, the capacitance C' is virtually identical to the magnitude of the capacitor 160 because the circuit 130a is essentially a capacitor connected between node 142 and ground.

The magnitude of the variable conductance 168 (indicated as g') as a function of the gate voltage $V_{GATE}$ applied to transistor 162 is plotted in FIG. 2E. When the gate voltage $V_{GATE}$ is low, the resistance of transistor 162, modeled as the variable resistor 164, is high (again assuming an N-channel transistor), and not much current flows through the transistor 162. Consequently the conductance g' is very low (see, for example, region 170) because the transistor 162 is almost off and the circuit 130a is virtually an open circuit. When the gate voltage $V_{GATE}$ is high, the resistance of the transistor 162 is low, and the capacitor 160 terminal is held robustly to ground. Consequently, the conductance g' is very low in this case as well (see, for example, region 172) because the circuit 130a is essentially a capacitor connected between node 142 and ground. However, at intermediate gate voltages, both the resistor and the capacitor interact and the conductance g' exhibits a peak (region 174). As long as the VCO circuit (or other circuit to which connected) has enough gain to support the necessary current flow through this conductance, the variable capacitor 130a circuit may be effectively used to provide a variable amount of capacitance that is controlled by an analog gate voltage $V_{GATE}$, as shown in FIG. 2D.

While a single variable capacitor circuit as shown in FIG. 4A indeed functions as a variable capacitor, the performance of such a circuit is affected by certain semiconductor parameters, such as transistor threshold voltage and transistor mobility. Such variations in performance may be reduced, and greater precision and overall linearity of the variable capacitor may be achieved, by using a large group of such circuits connected in parallel, each having a separate capacitor and each controlled by a separate gate voltage control signal.

A differential LC tank circuit 200 is shown in FIG. 3 as one possible implementation of the circuit 110 shown earlier in FIG. 1A. LC tank circuit 200 is a composite tank including two LC tanks 222 and 224 distributed in four circuits or "quadrants." Each of tanks 222 and 224 is a differential tank including an inductor and differential capacitance pairs, and each differential capacitance pair corresponds to a quadrant of the composite tank 200. LC tank 222 includes inductor 232, positive side variable capacitance $C_1$, and negative side variable capacitance $C_2$. LC tank 224 includes inductor 234, negative side variable capacitance $C_3$, and positive side variable capacitance $C_4$. Each of the quadrants 242, 244, 246, 248 of tank 200 includes a variable capacitor $C_i$. Quadrant 242 includes capacitor $C_1$; quadrant 244 includes capacitor $C_2$; quadrant 246 includes capacitor $C_3$; and quadrant 248 includes capacitor $C_4$. More or less than two of such tanks and four of such quadrant circuits may be implemented.

Each variable capacitor $C_i$ represents a composite capacitance which is implemented using an array of selectivity enabled capacitors. The capacitors of the array are individually coupled to or decoupled from the tank circuit (e.g., switched on or off, in whole or in part) by corresponding switches controlled by control signals received via node 212 from a control circuit 213. The switches allow for the selection of the individual capacitors and therefore the control of the overall capacitance of each of $C_1$, $C_2$, $C_3$, $C_4$.

The use of many selectively enabled capacitors helps to ensure a proper tuning range. For example, a capacitor array varactor including many, very small, selectively enabled capacitors may be used in order to achieve very low gain with good linear response of the output signal to input adjustments. For example, a VCO might have a total frequency tuning range of ±1.5% which translates into capacitor tuning range of ±3%. A tunable varactor capacitance such as $C_1$ may be divided into 128 units (e.g., cells) such that each unit is ±3%/128=0.02%. 128 capacitors may be selectively turned on or off to control the overall range of the total capacitance of the 128 capacitor array. For a tank capacitance of 4 pF, each unit size is 0.02%*4 pF=0.8 pF. That is, the change in capacitance $\Delta C=2*\Delta f/f_O*C_{tank}=0.8$ pF. However, it is often inconvenient to implement such small capacitors.

Figure 4:
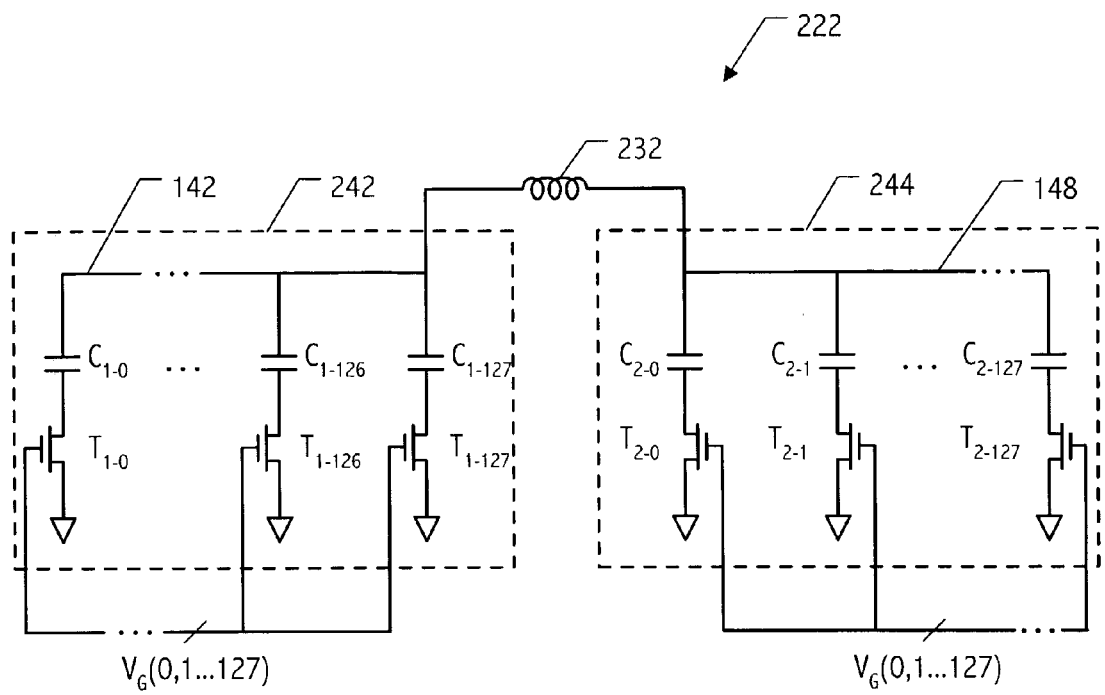
FIG. 4 is a schematic diagram of an LC tank circuit including a variable capacitance circuit in accordance with the present invention.

As shown in FIG. 4, the capacitance $C_1$ of quadrant circuit 242 includes a set of capacitance-switch cells coupled in parallel between node 142 and the common ground node. Each cell includes a capacitor and switch coupled in series. One such cell in quadrant 242 includes a capacitor $C_{1-0}$ whose first terminal is coupled to node 142 and whose second terminal is coupled to ground by transistor $T_{1-0}$ when a gate control signal $V_G(i)$ conveyed on node 212 is at a suitable voltage (e.g., a voltage greater than the transistor threshold voltage such as the voltage $V_2$ in FIG. 13). This cell and a complementary cell in quadrant 244 form a differential cell pair. The complementary cell includes a second capacitor $C_{2-0}$ whose first terminal is coupled to node 148 and whose second terminal is coupled to ground by transistor $T_{2-0}$. When a gate control signal $V_G(i)$ conveyed on node 212 is at a suitable voltage (e.g., greater than the transistor threshold voltage such as the voltage $V_2$ in FIG. 13).

Each cell in FIG. 4 is similar in structure and operation to the cell shown in FIG. 2A, but other functionally equivalent or modified cells may be used. In the particular embodiment shown in FIG. 4, quadrant circuit 242 includes 128 instances of such cells. Thus, capacitance $C_1$ includes 128 capacitors $C_{1-0}$ through $C_{1-127}$, each of which are selectable by or having an effective capacitance controllable by a corresponding transistor $T_{1-0}$ through $T_{1-127}$.

Each cell receives a corresponding control signal at the gate of its corresponding transistor. Each control signal may be represented as a bit of a composite control signal $V_G$ from which each of the control lines $V_G(0:127)$ is generated. FIG. 4 shows a "128-bit" $V_G$ control signal providing 128 control signals to 128 transistors. The state of each of the transistors individually varies the effective capacitance of a corresponding one of the 128 capacitors to control the overall capacitance $C_1$ of quadrant circuit 242. The control signal $V_G$ and the structure of the quadrants may take many forms as discussed below.

As used herein, the different values of $V_G(i)$ are often referred to as "bits" within a control signal $V_G$, but such terminology is used as a convention herein to describe multiple control signals being used for similar purposes, and although such values $V_G$ may be implemented at some point in a circuit as digital bits of some digital signal $V_G$, the use of the term "bit" is not intended to limit the portions of the composite control signal to digital values. Rather, in the presently described embodiment, each control line corresponding to and referenced as a bit acts as an analog control signal generated, for example, from a single analog control signal (e.g., $V_{GA}$) derived from a digital control signal (e.g., $V_{GD}$) using a DAC with voltage expander or other appropriate circuitry.

In one embodiment using the variable capacitance circuits 242 and 244, the various gate control voltages are provided by a voltage expander (not shown), which receives a VCO control voltage $V_{IN}$ and generates a plurality of expanded VCO control voltages $V_G(i)=V_G(0)$, $V_G(1)$, ... $V_G(N)$ corresponding to the VCO control voltage. For example, the expanded VCO control voltages may follow the following relationship:

$V_G(i)=0$ when $(V_{IN}+i\cdot V_{OFFSET}+V_{BIAS})\leq 0$ $V_G(i)=V_{IN}+(i)(V_{OFFSET})+V_{BIAS}$ when $0<(V_{IN}+i\cdot V_{OFFSET}+V_{BIAS})<V_{REF}$ $V_G(i)=V_{REF}$ when $(V_{IN}+i\cdot V_{OFFSET}+V_{BIAS})\geq V_{REF}$ As this relationship suggests, the $V_{OFFSET}$ and $V_{BIAS}$ values may be chosen to provide a plurality of substantially evenly-spaced output voltage levels that are related to the input voltage $V_{IN}$. The $V_{OFFSET}$ and $V_{BIAS}$ values may be chosen so that any number of the plurality of substantially evenly-spaced output voltage levels may be greater in voltage than the input voltage $V_{IN}$, with others of the plurality of output voltage levels that are lower in voltage than the input voltage $V_{IN}$. For example, all of the output voltage levels $V_G(i)$ may be chosen to be greater in voltage than the input voltage $V_{IN}$. The input voltage $V_{IN}$ need not be replicated on one of the plurality of output voltage levels. However, as the voltage expander name somewhat implies (but does not necessarily so require), the $V_{OFFSET}$ and $V_{BIAS}$ values may be chosen to provide a plurality of substantially evenly-spaced output voltage levels $V_G(i)$ that are nominally centered about the input voltage $V_{IN}$.

As a specific example, the voltage expander may be configured to generate 128 separate output voltages each 500 mV apart and centered as a group around the input voltage. Assuming that $V_G(0)$ is the highest voltage and that $V_G(127)$ is the lowest voltage, the 64th output voltage $V_G(64)$ is then substantially equal to the input voltage (i.e., the VCO control voltage). As the VCO control voltage increases or decreases, each of the $V_G(i)$ output signals increases or decreases in the same direction and by substantially the same amount.

Figure 13:
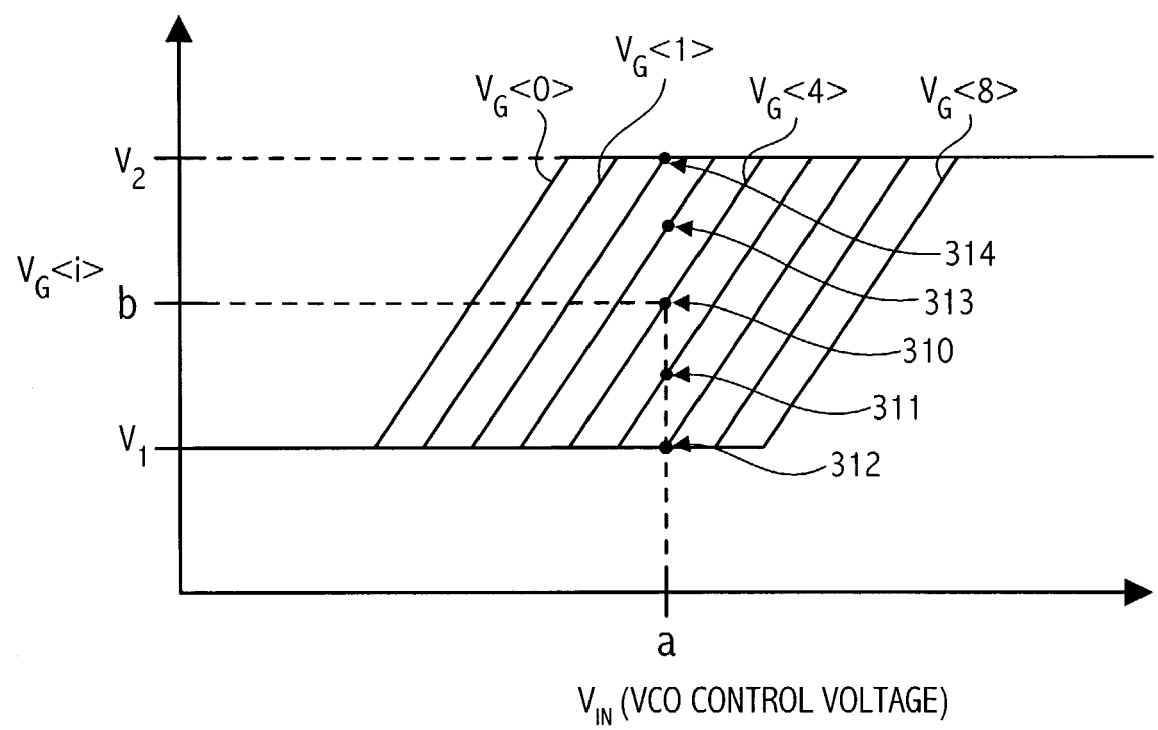
FIG. 13 is a waveform diagram of exemplary control signals useful for the circuits shown herein.

The linear behavior of each $V_G(0)$ signal may be intentionally or unintentionally limited to an upper and lower bound, as shown in FIG. 13. Each of several exemplary waveforms $V_G(0)$, $V_G(1)$, . . . $V_G(8)$ is plotted as a function of the input voltage (in this example, the VCO control voltage discussed above). Each $V_G(i)$ output signal linearly tracks the input voltage with a corresponding offset voltage. However, the maximum voltage of each $V_G(i)$ signal is limited to $V_2$ volts, and the minimum voltage of each $V_G(i)$ signal is limited to $V_1$ volts. Such voltage limits may arise from the output range of the voltage expander circuitry and, for example, may be substantially equal to the power supply voltages used in the design of the voltage expander (i.e., $V_{DD}$ and ground). Alternatively, one or more of the voltage limits may be arbitrarily chosen to be a non-power supply value. In the exemplary circuit shown, the voltage limits arise from the head room of the design, and thus the value of $V_2$ is just below $V_{DD}$, while the value of $V_1$ is just above ground. In the tank 222, the lower limit should preferably be chosen to be lower than the transistor threshold value of the switch transistors such as transistors $T_{1-0}$ and $T_{2-0}$ (assuming, as shown, N-channel transistors), while the upper limit should preferably be chosen to be higher than the threshold value of the switch transistors by an amount sufficient to substantially turn on the transistors.

Additional details of voltage expanders as used with a plurality of individual variable capacitance circuits in an LC tank circuit for a VCO are described in U.S. Pat. No. 6,137,372 to Welland entitled "Method and apparatus for providing coarse and fine tuning control for synthesizing high-frequency signals for wireless communications" which is incorporated herein by reference in its entirety, and in the U.S. provisional patent application Ser. No. 60/360,333, entitled "Digital Expander Apparatus and Method for Generating Multiple Analog Control Signals Particularly Useful for Controlling a Sub-Varactor Array of a Voltage Controlled Oscillator," filed Feb. 28, 2002, and naming Yunteng Huang and Bruno Garlepp as inventors, and which is incorporated herein by reference in its entirety.

Traditionally, the capacitance values of capacitances $C_1$, $C_2$, $C_3$, and $C_4$ are controlled simultaneously in a fully differential manner. For example, the same control signals (e.g., from a voltage expander) are coupled to control differential pair switch-capacitor cells in unison so that there are no differential imbalances in LC tank 222. In the present embodiment, however, the capacitances $C_1$, $C_2$, $C_3$, and $C_4$ are tunable individually instead of simultaneously to provide a "pseudo-differential" LC tank 222. As used herein, "pseudo-differential" refers to the fact that a slight differential imbalance is introduced. In this case, the imbalance is introduced the benefit of finer and more linear tunability of the tank capacitance, and thereby provide the same benefit on circuits coupled thereto such as a VCO.

Figure 5:
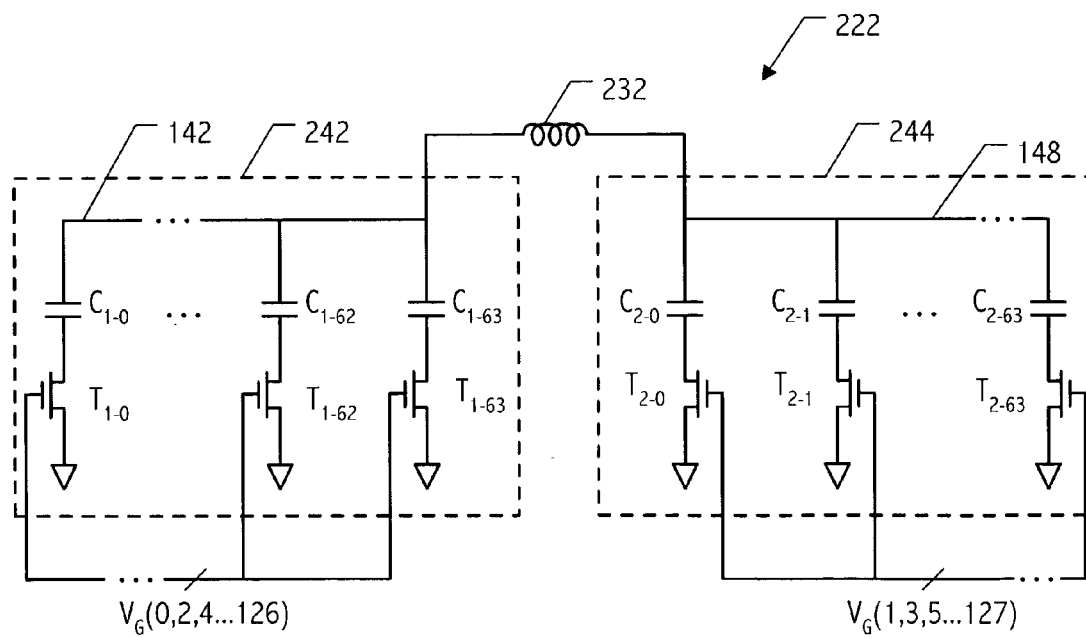
FIG. 5 is a schematic diagram of an LC tank circuit including an imbalanced, differential, variable capacitance circuit having fewer, asymmetrical control lines.

FIG. 5 shows another embodiment of LC tank 222 which may or may not be used in conjunction with another LC tank 242. Each of capacitances $C_1$ and $C_2$ of LC tank 222 receives a different set of control lines than the other quadrant. For example, the even bits (0,2,4 . . . 126) of control signal $V_G$ are applied to the positive side transistors $T_{1-i}$, and the odd bits (1,3,5 . . . 127) of control signal $V_G$ are applied to the negative side transistors $T_{2-i}$.

By sending different control signals to otherwise fully differential cell pairs such as the cells including capacitors $C_{1-0}$ and $C_{2-0}$, the overall capacitance of LC tank 222 may be more finely tuned. For example, the effective capacitance of capacitor $C_{1-0}$ is controlled by the value of the control signal $V_G(0)$, and the effective capacitance of capacitor $C_{2-0}$ is controlled by the value of the control signal $V_G(1)$. Since each control signal may be controlled to transition at different times instead of the more traditionally identical times with identical control signals, the effective capacitance of each of $C_1$ and C2 is more finely tunable and more linear in response to the control signals because the graduality of the transition may be enhanced by transitioning the second control signal at time slightly offset from the time of the transition of the first control signal. The time offset between the transitions is determined by how $V_{IN}$ changes and by the value of $V_{OFFSET}$, as shown in the equations discussed above.

Another advantage of tuning the capacitance $C_1$ and $C_2$ individually instead of simultaneously is that fewer and larger capacitors may be used (as opposed to obtaining improved resolution, for example, but some combination of such advantages may be used of course). For example, LC tank 222 includes 128 capacitors instead of the 256 capacitors in the embodiment of FIG. 4. Also, each of capacitances $C_1$ and $C_2$ are composite capacitances created from 64 capacitors each instead of the 128 capacitors shown on each side of inductor 232 in the embodiment of FIG. 4. The number of varactor control lines is thereby reduced by a factor of 2. Also, each of the capacitance units can be bigger (e.g., two or four times bigger in the embodiments discussed herein) for the same frequency tuning resolution. Thus, by structuring a pseudo-differential LC tank as shown in FIG. 5, the use of disadvantageously small varactor capacitance units (e.g., 0.8 fF) is avoided. In this case, the change in capacitance ΔC=2*0.8fF=1.6fF, an improvement over the initially anticipated value of 0.8FF.

Controlling the capacitors individually causes an imbalance in the LC tank 200 and an imbalance between LC tanks 222 and 224. However, since such an imbalance introduces a differential tank capacitance mismatch on the order of 0.1%, it is on the same order of magnitude as typical intrinsic processing mismatches found in modern integrated circuits. Thus, the imbalance introduced by the foregoing method of individual control of differential capacitance units does not present any real disadvantages to the operation of many circuits.

Figure 6:
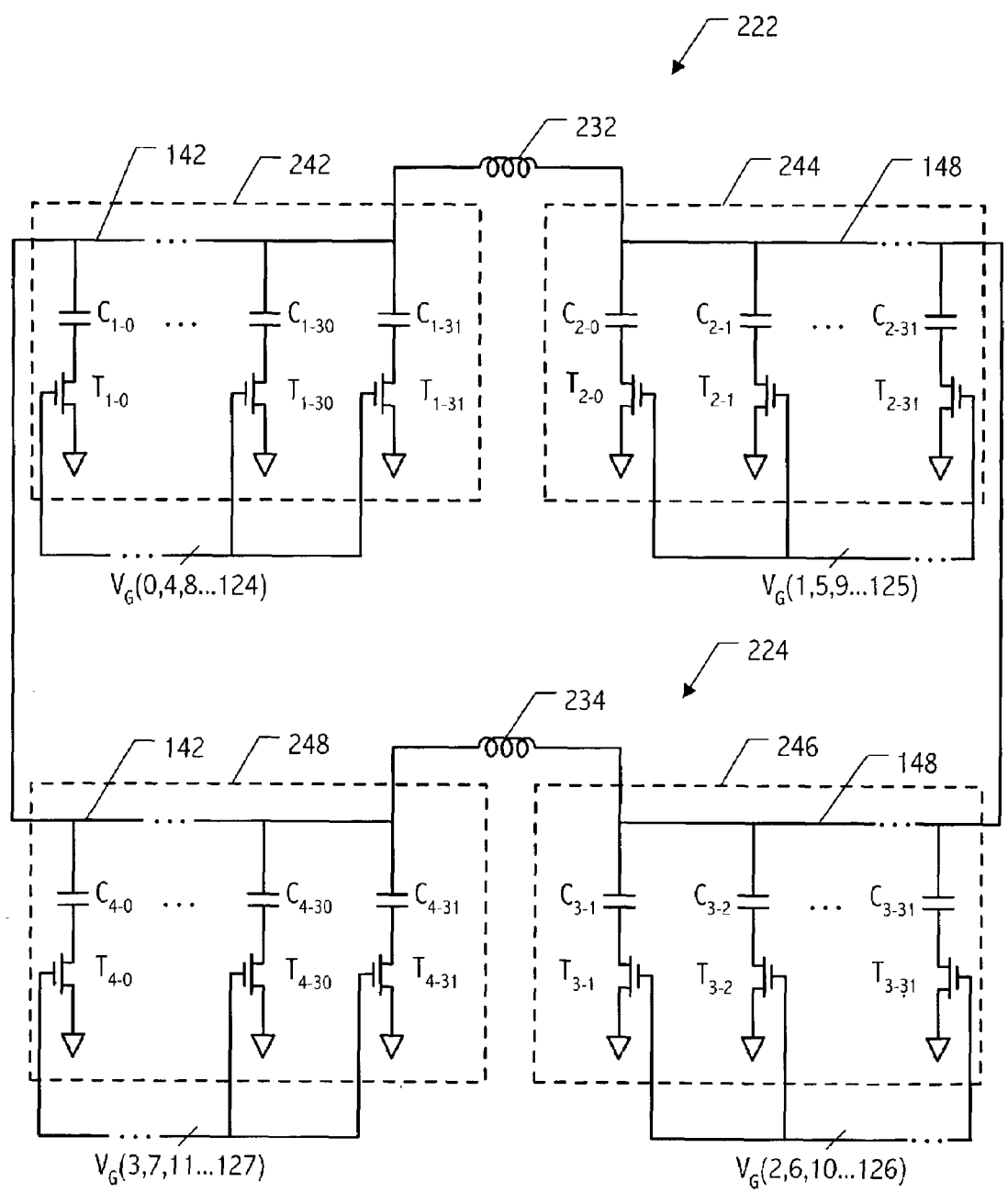
FIG. 6 is a schematic diagram of an LC tank circuit including an imbalanced, differential, variable capacitance circuit having asymmetrical control lines and reduced magnetic noise.

FIG. 6 shows a pseudo-differential embodiment of LC tank 200 in which each quadrant receives different bits than the other quadrant. For example, each quadrant receives a set of control signals corresponding to every fourth bit of the control signal $V_G$. As shown, the bits (0,4,8 . . . 124) of control signal $V_G$ are applied to the transistors of quadrant 242 of the first LC tank 222, bits (1,5,9 . . . 125) of control signal $V_G$ are applied to the transistors of quadrant 244 of the first LC tank 222, bits (2,6,10 . . . 126) of control signal $V_G$ are applied to the transistors of quadrant 246 of the second LC tank 224, and bits (3,7,11 . . . 127) of control signal $V_G$ are applied to the transistors of quadrant 248 of the second LC tank 224.

In addition to the advantages described above with reference to FIG. 5, such as providing finer tunability, using larger and fewer capacitors, and reducing the number of control lines, here by a factor of 4, this embodiment also provides the added advantage that the two parallel tanks 222 and 224 form a magnetic dipole, thereby providing some rejection of magnetic coupling into the LC tank 200, which in turn yields better phase noise performance. In this case, the change in capacitance $\Delta C = 4*0.8$ fF$=3.2$fF. Capacitors of 3.2fF are easier to implement.

Figure 7:
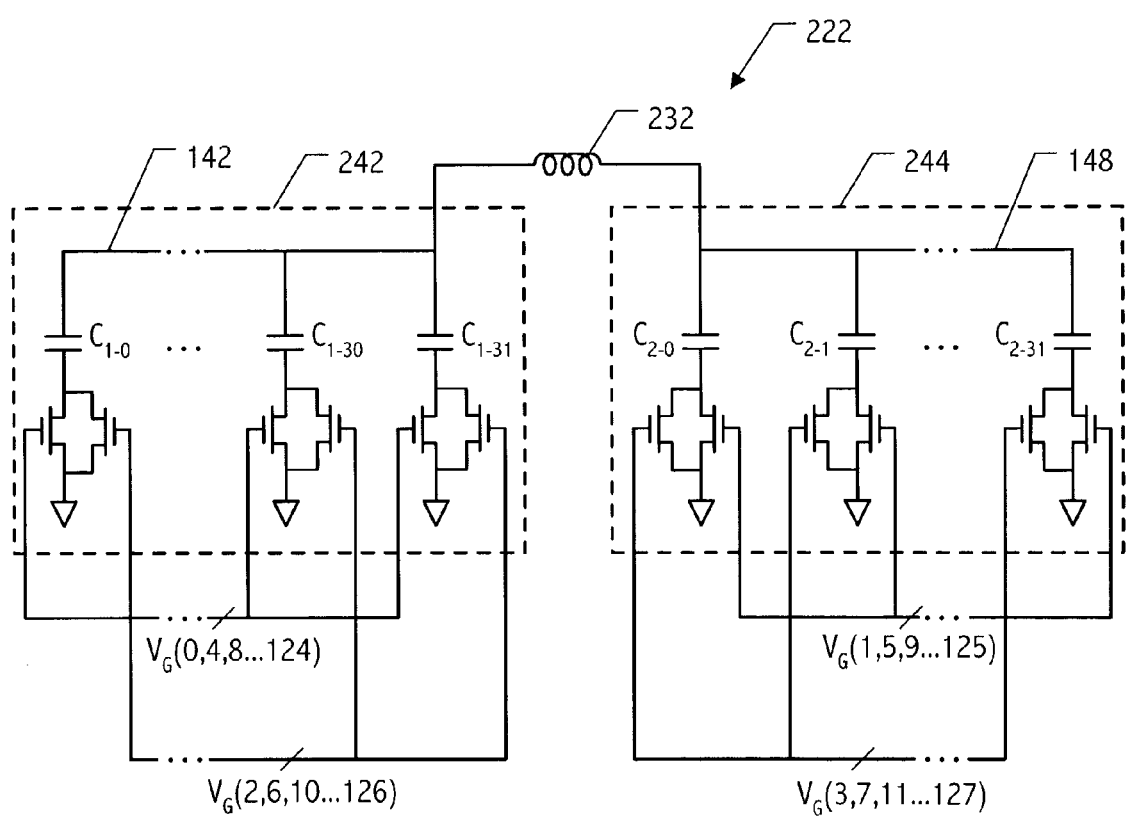
FIG. 7 is a schematic diagram of an LC tank circuit including an imbalanced, differential, variable capacitance circuit having asymmetrical control lines for improved linear response.

FIG. 7 shows a portion of pseudo-differential LC tank 200 in which each capacitor-switch cell includes an additional transistor to enhance the ability to fine tune the capacitance of the cell. In each case, the capacitor is coupled in series with parallel coupled transistors. Thus, each capacitor corresponds to two transistors within the cell, and the set of capacitors in each quadrant corresponds to each of a first set of transistors and a second set of transistors.

Referring again to FIG. 7, each LC tank receives the same control signals, but each quadrant within each of tanks 222 and 224 receive different control signals. For example, the even bits (0,2,4 . . . 126) of control signal $V_G$ are applied to the transistors of quadrant 242, and the odd bits (1,3,5 . . . 127) of control signal $V_G$ are applied to the transistors of quadrant 244. Bits (0,4,8 . . . 124) of control signal $V_G$ are applied to a first set of transistors of quadrant 242 and bits (2,6,10 . . . 126) of control signal $V_G$ are applied to a second set of transistors of quadrant 246. Bits (1,5,9 . . . 125) of control signal $V_G$ are applied to a first set of transistors of quadrant 244, and bits (3,7,11 . . . 127) of control signal $V_G$ are applied to a second set of transistors of quadrant 244.

The structure of each cell illustrated in FIG. 7 allows the capacitance of each cell to be more finely tuned. For example, the capacitance of capacitor $C_{1-0}$ is controlled by the value of the control signals $V_G(0)$ and $V_G(2)$. Since each may be controlled to transition at different times, the effective capacitance of $C_{1-0}$ is more finely tunable and more linear in response to the control signals because the graduality of the transition may be enhanced by transitioning the second control signal at time slightly offset from the time of the transition of the first control signal. This also reduces capacitive energy loss as the second transistor switches on at a later time. In addition to providing finer tunability, this embodiment also provides the added advantage that the two parallel tanks 222 and 224 form a magnetic dipole, thereby providing some rejection of magnetic coupling into the LC tank 200, which in turn yields better phase noise performance.

Figure 8:
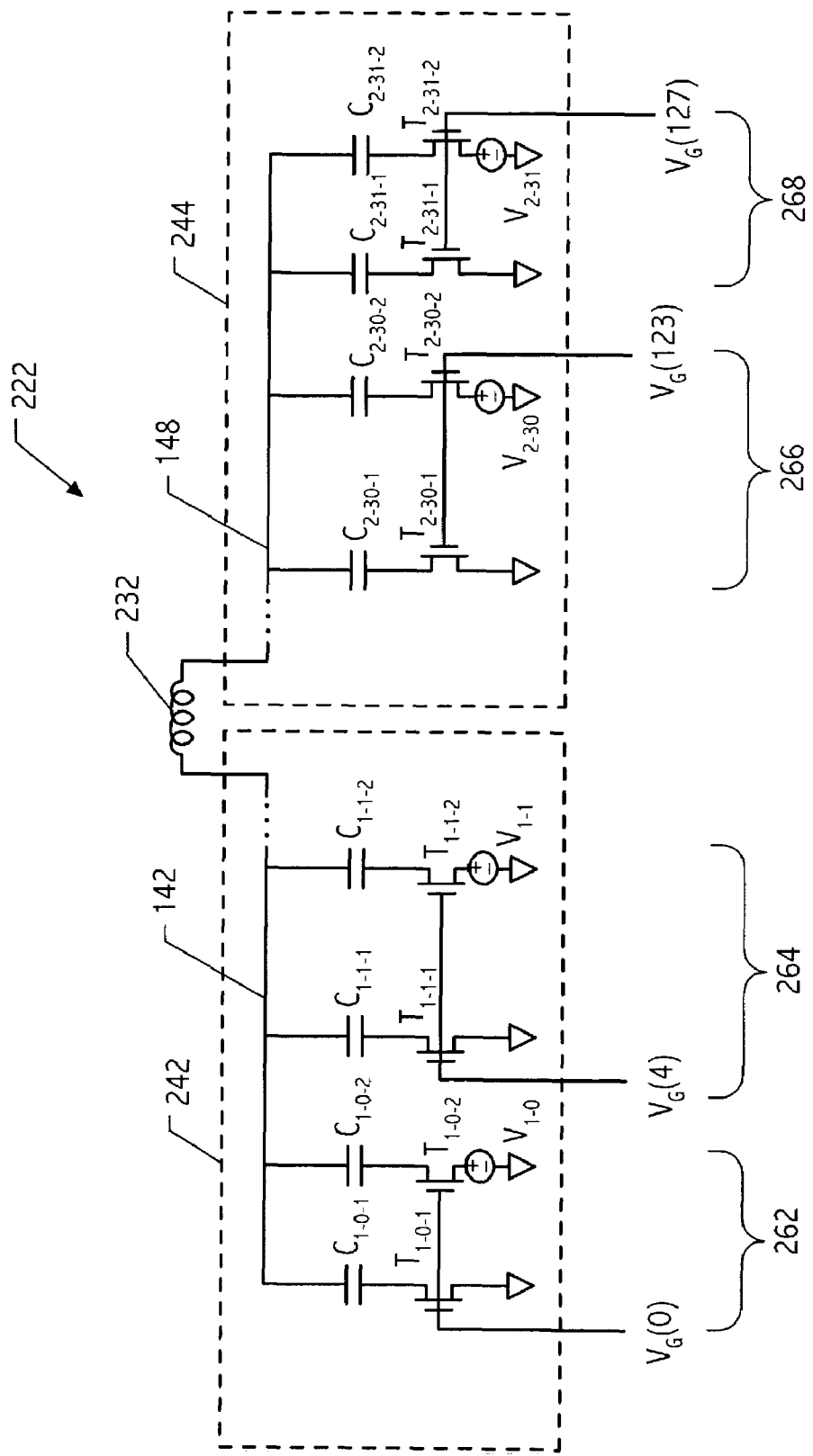
FIG. 8 is a schematic diagram of an LC tank circuit including an imbalanced, differential, variable capacitance circuit having fewer asymmetrical control lines and compensating offsets.

FIG. 8 shows a portion of pseudo-differential LC tank 200 in which each cell of each quadrant receives every fourth control signal as described above with reference to FIG. 6. An embodiment of LC tank 222 is shown in which each capacitor-switch cell includes a parallel coupling of a first switch and a second switch with offset to delay the switching of the second switch. As shown, the first switch portion of each cell is a transistor as described above, and the second switch portion of each cell is a transistor coupled in series with a voltage offset.

More specifically, each cell includes a first capacitor is coupled in series with a first transistor between a first node and a second node, and a second capacitor is coupled in series with a second transistor and a voltage offset between the first and second nodes. A voltage control signal is applied to each of the transistors. For example, a first cell 262 in capacitance $C_1$ of quadrant 242 includes a first capacitor $C_{1-0-1}$ coupled in series with a first transistor $T_{1-0-1}$ between node 142 and common ground. The cell 262 also includes a second capacitor $C_{1-0-2}$ coupled in series with a second transistor $T_{1-0-2}$ and a voltage offset $V_{1-0}$. The voltage control signal $V_G(0)$ is applied to the gates of transistors $T_{1-0-1}$ and $T_{1-0-2}$.

Figure 10:
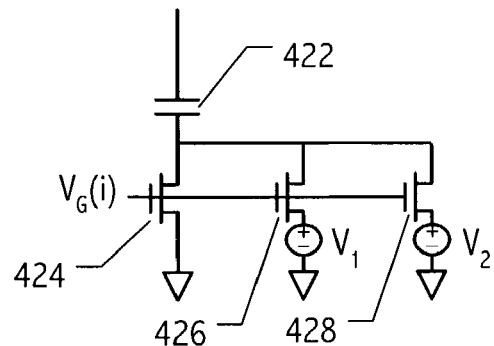
FIG. 10 is a schematic diagram of a switch-capacitance cell with offset circuitry suitable for use in an LC tank circuit.

In one embodiment, $V_{1-0}=200$ mV. Other types of switch capacitor cells may use other types of offsets and offsets of different values. Also, additional offsets may be used as shown in FIG. 10. FIG. 10 also shows a variation in which the drains of transistors 426 and 428 are coupled to the drain of transistor 424 instead of being coupled to additional capacitors as shown in FIG. 8. The first voltage offset $V_1$ switched by transistor 426 may be 200 mV, and the second voltage offset $V_2$ switched by transistor 428 may be 100 mV. Thus, each capacitor may correspond to two, three or more transistors within the cell, and the set of capacitors in each quadrant may correspond to each multiple sets of transistors, some of the sets of transistors corresponding to sets of voltage offsets.

The structure of each cell illustrated in FIGS. 8 and 10 allows the capacitance of each cell to be more finely tuned and the overall change in capacitance of the tank is more linear. This is accomplished by increasing the voltage range over which the transition from zero capacitance to full capacitance of the cell occurs. This is because the transistor with the offset transitions slightly after (or before) the transistor without the offset even though the same control signal is being applied to each of the transistors. Since each transistor switches at slightly different times, the effective capacitance of $C_{1-0}$ of the cell 262, for example, the transition is more linear, and the number of control lines is reduced. The voltage delay adds a level of granularity in control so that, for example, the linearity of 256 control lines may be achieved with 128 control lines.

Figure 9:
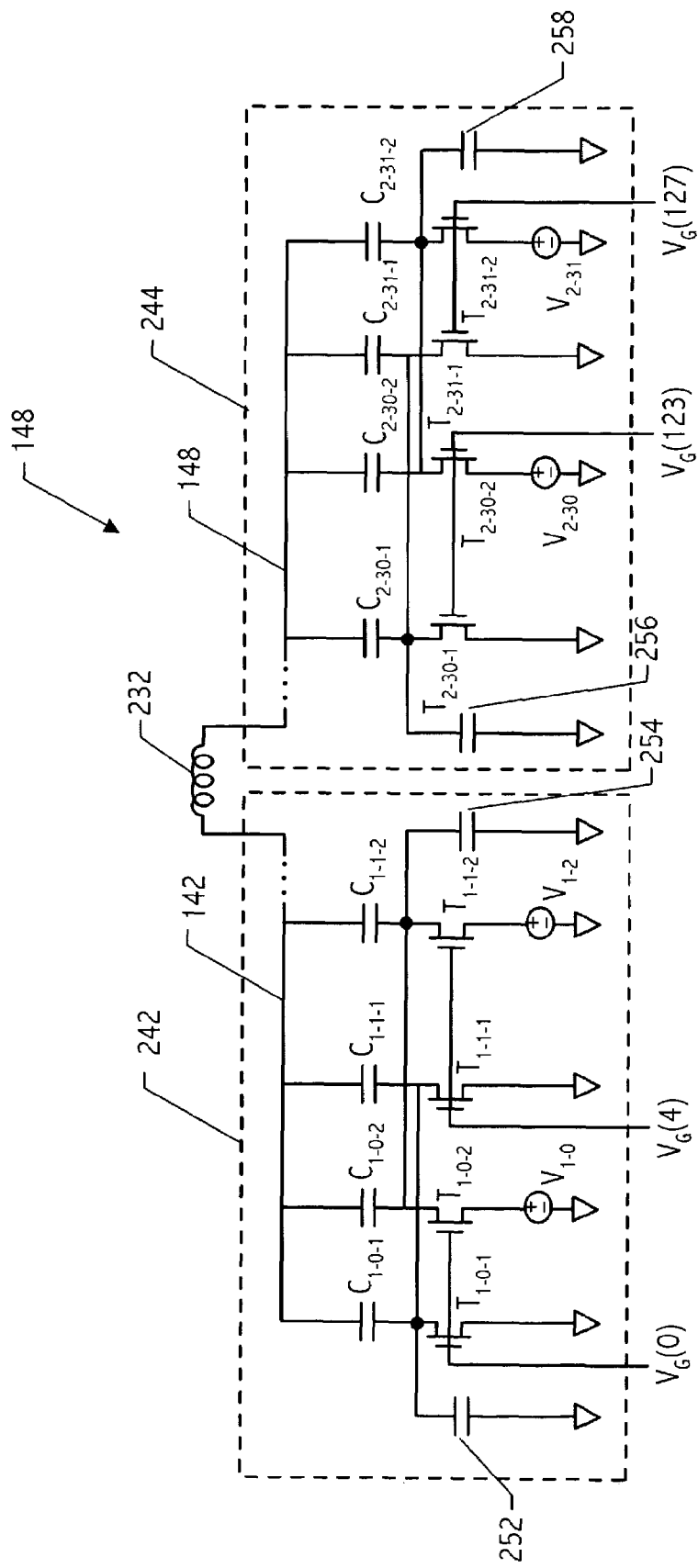
FIG. 9 is a schematic diagram of an LC tank circuit including an imbalanced, differential, variable capacitance circuit having fewer asymmetrical control lines with compensating offsets and cell crossover connections for improved linearity.
Figure 11:
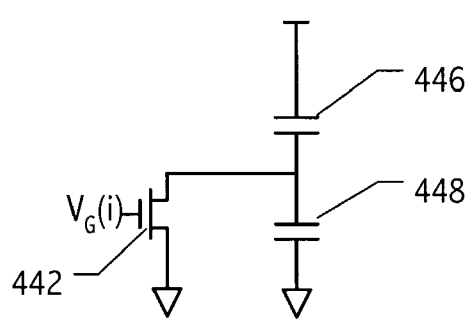
FIG. 11 is a schematic diagram of a switch-capacitance cell for reduced change in capacitance suitable for use in an LC tank circuit.
Figure 12:
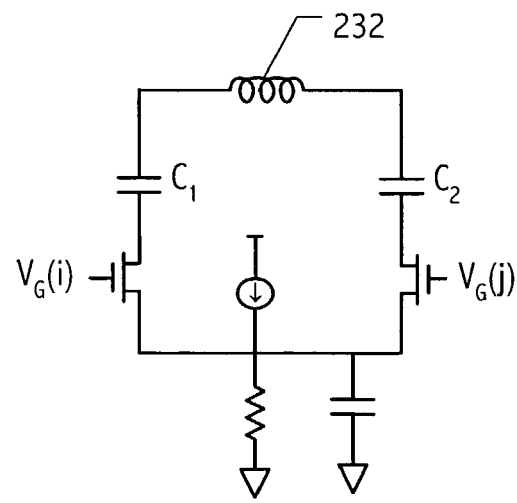
FIG. 12 is a schematic diagram of another embodiment of a switch-capacitance cell with current source-based offset suitable for use in an LC tank circuit.

FIG. 9 shows an embodiment of LC tank 222 which includes cells which combine the advantages of the control signal offset described above with reference to FIG. 7 and the voltage offset described above with reference to FIG. 8. The switch-capacitor cells of FIG. 9 also make use of an additional capacitors 252, 254, 256, 258. The use of a capacitor in parallel with the switching transistor is shown in FIG. 11. The cell in FIG. 12 shows a cell, or portion of a cell, including an offset using current source 462 and resistance 464 with capacitance 468 for low impedance at high frequencies.

The above description is intended to describe at least one embodiment of the invention. The foregoing components and devices are used herein as examples for sake of conceptual clarity. Consequently, as used herein these specific exemplars are intended to be representative of their more general classes. Furthermore, in general, the use of any specific exemplar herein is also intended to be representative of its class and the noninclusion of any specific devices in any exemplary lists herein should not be taken as indicating that limitation is desired. Also, although the embodiments described above include circuit elements such as capacitors and transistors within silicon or chips, other embodiments may include such circuit elements within synthesizable cores, or simply cores, which are software implementations of circuits such as microprocessors and/or microcontrollers. Thus, the above description is not intended to define the scope of the invention. Rather, the scope of the invention is defined in the claims below. Thus, other embodiments of the invention include other variations, modifications, additions, and/or improvements to the above description.

Those skilled in the art will recognize that circuit elements in circuit diagrams and boundaries between logic blocks are often illustrative and that alternative embodiments may merge logic blocks or circuit elements or impose an alternate decomposition of functionality upon various logic blocks or circuit elements. For example, although various "cells" are characterized above as distinct entities within various blocks such as quadrants or tanks, such cells may be cross-coupled with other cells and circuitry to the extent that the borders between cells becomes blurred, and the cells may be characterized as being separate from or within different quadrants or other logic blocks. Moreover, alternative embodiments may combine multiple instances of a particular components.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

The transistors described herein (whether bipolar, field effect, etc.) may be conceptualized as having a control terminal which controls the flow of current between a first current handling terminal and a second current handling terminal. An appropriate condition on the control terminal causes a current to flow from/to the first current handling terminal and to/from the second current handling terminal.

For example, in a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current flowing between the base and emitter causes an emitter-to-collector current to flow.

Also, although field effect transistors (FETs) are frequently discussed as having a drain, a gate, and a source, in most such devices the drain is interchangeable with the source. This is because the layout and semiconductor processing of the transistor is frequently symmetrical. For an n-channel FET, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in n-channel FET device equations merely refers to which drain or source terminal has the lower voltage at any given point in time. For example, the "source" of the n-channel device of a bi-directional CMOS transfer gate depends on which side of the transfer gate is at the lower voltage. To reflect this symmetry of most n-channel FET devices, the control terminal may be deemed the gate, the first current handling terminal may be termed the "drain/source", and the second current handling terminal may be termed the "source/drain". Such a description is equally valid for a p-channel FET device, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, interchangeable.

Insulated gate FETs (IGFETs) are commonly referred to as MOSFET devices (which literally is an acronym for "Metal-Oxide-Semiconductor Field Effect Transistor"), even though the gate material may be polysilicon or some material other than metal, and the dielectric may be oxynitride, nitride, or some material other than an oxide. The use of such historical legacy terms as MOSFET should not be interpreted to literally specify a metal gate FET having an oxide dielectric unless the context indicates that such a restriction is intended.

Regarding the signals described herein, those skilled in the art will recognize that a signal may be directly transmitted from a first logic block to a second logic block, or a signal may be modified (e.g., amplified, attenuated, delayed, latched, buffered, inverted, filtered or otherwise converted, etc.) between such logic blocks. Although the signals of the above described embodiment may be characterized as being transmitted from one block or element to the next, other embodiments of the invention may include modified signals in place of such directly transmitted signals as long as the informational and/or functional aspect of the signal is transmitted between blocks or elements. To some extent, a signal input at a second logic block may be conceptualized as a second signal derived from a first signal output from a first logic block due to physical limitations of the circuitry involved (e.g., there will inevitably be some attenuation and delay). Therefore, as used herein and for ease of discussion, a signal between logic blocks includes a second signal derived from a first signal, the first signal, and/or any modifications to the first signal, whether due to circuit limitations or due to passage through other circuit elements which do not change the informational and/or final functional aspect of the first signal.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A pseudo-differential LC tank circuit comprising:
an inductance circuit having first and second terminals;
a variable capacitance circuit coupled in parallel with the inductance circuit, the variable capacitance circuit including a first variable capacitance coupled between the first terminal and a common ground node, and a second variable capacitance coupled between the second terminal and the common ground node, the first and second variable capacitances coupled respectively to receive a first plurality of control lines and a second plurality of control lines for controlling the capacitance of the first and second variable capacitance circuits in a pseudo-differential manner.

2. The circuit of claim 1 wherein the first plurality of control lines and the second plurality of control lines are mutually exclusive and thereby each includes only control lines not in common with the other.

3. The circuit of claim 1 further comprising first and second tanks, wherein
the inductance circuit includes a first inductance in the first tank, and a second inductance in the second tank, the first and second inductances being coupled in parallel;
the first variable capacitance includes a first quadrant variable capacitance in the first tank and a second quadrant variable capacitance in the second tank;
the second variable capacitance includes a third quadrant variable capacitance in the first tank and a fourth quadrant variable capacitance in the second tank;
the first and third quadrant variable capacitances are coupled in series with the common ground between the first and second terminals; and
the second and fourth quadrant variable capacitances are coupled in series with the common ground between the first and second terminals;
wherein the first tank is coupled to receive a set of control signals having signal values different than signal values of control signals received by the second tank.

4. The circuit of claim 3 wherein each quadrant is coupled to receive a different set of control signals than any other of the quadrants.

5. The circuit of claim 4 wherein each quadrant is coupled to receive only control signals unique to that quadrant.

6. The circuit of claim 1 wherein each of the first variable capacitance and the second variable capacitance comprise an array of capacitor-switch cells, each of the capacitor-switch cells including a capacitor, and a transistor for providing a controllable variable resistance to control the capacitance of each cell.

7. The circuit of claim 6 wherein the transistor in each cell comprises:
a first current handling terminal coupled to the capacitor; and
a control terminal coupled to receive one of the control lines.

8. The circuit of claim 7 wherein the transistor in each cell further comprises a second current handling terminal coupled to the common ground node.

9. The circuit of claim 8 wherein the transistor in each cell is a first transistor, and each cell further comprises a second transistor including first and second current handling terminals coupled to the first and second current handling terminals of the first transistor.

10. The circuit of claim 9 wherein at least one of the cells includes an offset element coupled to at least one of the first and second transistors so that the first and second transistors switch at different times.

11. The circuit of claim 10 wherein the offset element is a voltage source coupled in series with at least one of the first and second transistors of the at least one cell, and wherein control terminals of the first and second transistors are coupled to receive a first control signal.

12. The circuit of claim 7 wherein the transistor in each cell is a first transistor and the capacitor in each cell is a first capacitor, the first capacitor and first transistor coupled in series, and each cell further comprises a second capacitor, a second transistor and a voltage offset coupled in series, the first and second transistors coupled to receive a first control signal.

13. The circuit of claim 7 wherein the first current handling terminal of a transistor in each cell is coupled to a first current handling terminal of another transistor in another cell.

14. The circuit of claim 6 wherein the capacitor in each capacitor-switch cell of the array of capacitor-switch cells has a unit capacitance.

15. The circuit of claim 1 wherein the circuit is comprised within a semiconductor chip.

16. The circuit of claim 1 wherein the circuit is represented by software within a synthesizable core.

17. The circuit of claim 1 wherein each of the first and second variable capacitances are independently controllable without causing a change in value of the other.

18. The circuit of claim 1 wherein the capacitance introduced by the first variable capacitance circuit is slightly different from the capacitance introduced by the second variable capacitance circuit.

19. The circuit of claim 1 wherein individual ones of the first and second pluralities of control lines are responsive to respective ones of a plurality of substantially evenly-spaced voltage levels.

20. The circuit of claim 19 wherein the plurality of substantially evenly-spaced voltage levels are based, at least in part, on an input voltage, an offset voltage, and a bias voltage.

21. The circuit of claim 20 wherein the plurality of substantially evenly-spaced voltage levels are nominally centered about the input voltage.

22. An LC tank circuit comprising a differential pair of variable capacitance cells, the differential pair of cells including a first variable capacitance cell on a first differential side and a second variable capacitance cell on a second differential side, the first and second variable capacitance cells being controllable in a pseudo-differential manner to adjust the LC tank circuit.

23. The circuit of claim 22 wherein each of the first variable capacitance cell and the second variable capacitance cell comprise:
   a capacitor; and
   a variable resistance coupled to the capacitor and controllable to vary the capacitance of each respective cell.

24. The circuit of claim 23 wherein the variable resistance is a transistor which is coupled in series with the capacitor.

25. The circuit of claim 23 wherein the variable resistance is a transistor having a first current handling terminal coupled to the capacitor and a second current handling terminal coupled to a common ground node.

26. The circuit of claim 23 wherein
   the first variable capacitance is coupled to receive a first control signal for varying the capacitance;
   the second variable capacitance is coupled to receive a second control signal for varying the capacitance, the second control signal having a value different from a value of the first control signal.

27. The circuit of claim 22 wherein each of the first variable capacitance cell and the second variable capacitance cell comprise:
   a capacitor; and
   a first switch coupled in series with the capacitor;
   a second switch coupled in series with the capacitor and in parallel with the first switch, wherein the first and second switch are coupled to vary the capacitance of the cell.

28. The circuit of claim 27 wherein
   the first switch is a transistor having a first current handling terminal coupled to a first terminal of the capacitor and a second current handling terminal coupled to a common ground node; and
   the second switch is a transistor having a first current handling terminal coupled to the first terminal of the capacitor and a second current handling terminal coupled to a common ground node.

29. The circuit of claim 22 wherein each of the first variable capacitance cell and the second variable capacitance cell comprise:
   a capacitor; and
   a first switch coupled in series with the capacitor responsive to a control signal receivable at a first time; and an offset element coupled to the switch such that the switch changes state at a second time to change the capacitance of the cell.

30. The circuit of claim 29 wherein
   the offset element is a voltage source;
   the first switch is a transistor having a first current handling terminal coupled to a first terminal of the voltage source.

31. The circuit of claim 30 wherein
   the first switch includes a second current handling terminal coupled to the capacitor; and
   the voltage source includes a second terminal coupled to a common ground node.

32. The circuit of claim 22 wherein the circuit is comprised within a semiconductor chip.

33. The circuit of claim 22 wherein the circuit is represented by software within a synthesizable core.

34. The circuit of claim 22 wherein each of the first and second variable capacitance cells are independently controllable without causing a change in value of the other.

35. A capacitor array varactor comprising:
   a first array of capacitance devices controllable by first differential side control signals;
   a second array of capacitance devices controllable by second differential side control signals, wherein at least one of the first differential side control signals is adjustable independent from all of the second differential side control signals, and at least one of the second differential side control signals is adjustable independent from all of the first differential side control signals.

36. A method for operating an LC tank circuit, the method comprising:
   tuning a frequency of oscillation of a symmetrical LC tank circuit by introducing a differential imbalance to the LC tank circuit using non-periodic signals asymmetrically connected thereto.

37. The method, as recited in claim 36, further comprising introducing the differential imbalance by a first and a second plurality of control lines corresponding to respective ones of a first differential side circuit and a second differential side circuit of the LC tank circuit.

38. The method, as recited in claim 37, wherein the first and second differential side circuits of the LC tank circuit include corresponding variable capacitance cells coupled to respective ones of the first and second plurality of control lines.

39. The method of claim 37 wherein each of the first and second differential side circuits are independently controllable without causing a change in value of the other.

40. An LC tank circuit comprising:
   a first differential side circuit;
   a second differential side circuit;
   a control circuit coupled to convey a first plurality of control signals to the first differential side circuit and a second plurality of control signals to the second differential side circuit to introduce a differential imbalance in the LC tank circuit.

41. The circuit of claim 40 wherein each of the first and second differential side circuits are independently controllable without causing a change in value of the other.

42. A method for operating an LC tank circuit comprising:
   providing a first control signal to a first differential side circuit included in the LC tank circuit;
   providing a second control signal to a second differential side circuit included in the LC tank circuit so that a differential imbalance occurs in the LC tank circuit;

wherein the first and second differential side circuits are symmetrical.

43. The method of claim 42 wherein the differential circuit includes a pseudo-differential capacitor array varactor wherein the first and second differential side circuits include respective first and second capacitor-switch cell arrays, the method further comprising the step of providing the first and second control signals as part of respective first and second pluralities of pseudo-differential control signals.

44. The method of claim 42 further comprising the step of adjusting the first and second control signals to different values.

* * * * *